United States Patent [19]
Kelly et al.

[11] Patent Number: 5,229,776
[45] Date of Patent: Jul. 20, 1993

[54] METHOD FOR FIELD MONITORING OF A PHASED ARRAY MICROWAVE LANDING SYSTEM FAR FIELD ANTENNA PATTERN EMPLOYING A NEAR FIELD CORRECTION TECHNIQUE

[75] Inventors: Robert J. Kelly, Towson; Edward F. C. LaBerge, Baltimore, both of Md.

[73] Assignee: AlliedSignal Inc., Morris Township, Morris County, N.J.

[21] Appl. No.: 897,154

[22] Filed: Jun. 11, 1992

Related U.S. Application Data

[63] Continuation-in-part of Ser. No. 803,233, Dec. 5, 1991, abandoned.

[51] Int. Cl.$^5$ .................................................. G01S 7/40
[52] U.S. Cl. ....................................... 342/173; 342/35
[58] Field of Search ......................................... 342/35, 173

[56] References Cited

U.S. PATENT DOCUMENTS

| | | | |
|---|---|---|---|
| 3,879,733 | 4/1975 | Hansen et al. | 343/100 |
| 4,201,987 | 5/1980 | Tricoles et al. | 343/703 |
| 4,333,081 | 6/1982 | Höfgen | 342/173 X |
| 4,532,517 | 7/1985 | LaBarge et al. | 342/35 X |
| 4,553,145 | 11/1985 | Evans | 343/360 |
| 4,635,064 | 1/1987 | Chisholm | 342/408 |
| 4,661,820 | 4/1987 | Pouit et al. | 342/351 |
| 4,704,614 | 11/1987 | Poirier et al. | 343/703 |
| 4,757,316 | 7/1988 | Brault et al. | 342/173 |
| 4,764,772 | 8/1988 | Becker | 342/408 |
| 4,881,023 | 3/1989 | Gelernter et al. | 343/703 |
| 4,926,186 | 5/1990 | Kelly et al. | 342/360 |
| 4,990,921 | 2/1991 | Chisholm | 342/35 |
| 4,998,112 | 3/1991 | Franchi et al. | 342/360 |
| 5,130,716 | 7/1992 | Kleiber | 342/173 |
| 5,132,692 | 7/1992 | LaBarge | 342/173 |

Primary Examiner—T. H. Tubbesing
Attorney, Agent, or Firm—Howard G. Massung

[57] ABSTRACT

A method for obtaining the far field pattern of a phased array MLS antenna using measurements by a monitor located in the near field of the MLS antenna. The near field pattern differs from the far field pattern because of the presence of phase error terms in the measured near field pattern. The method comprises computing the Fourier transform of the complex conjugates of the phase error term of the near field pattern and convolving that transform with the measured near field pattern to obtain the far field pattern.

2 Claims, 7 Drawing Sheets

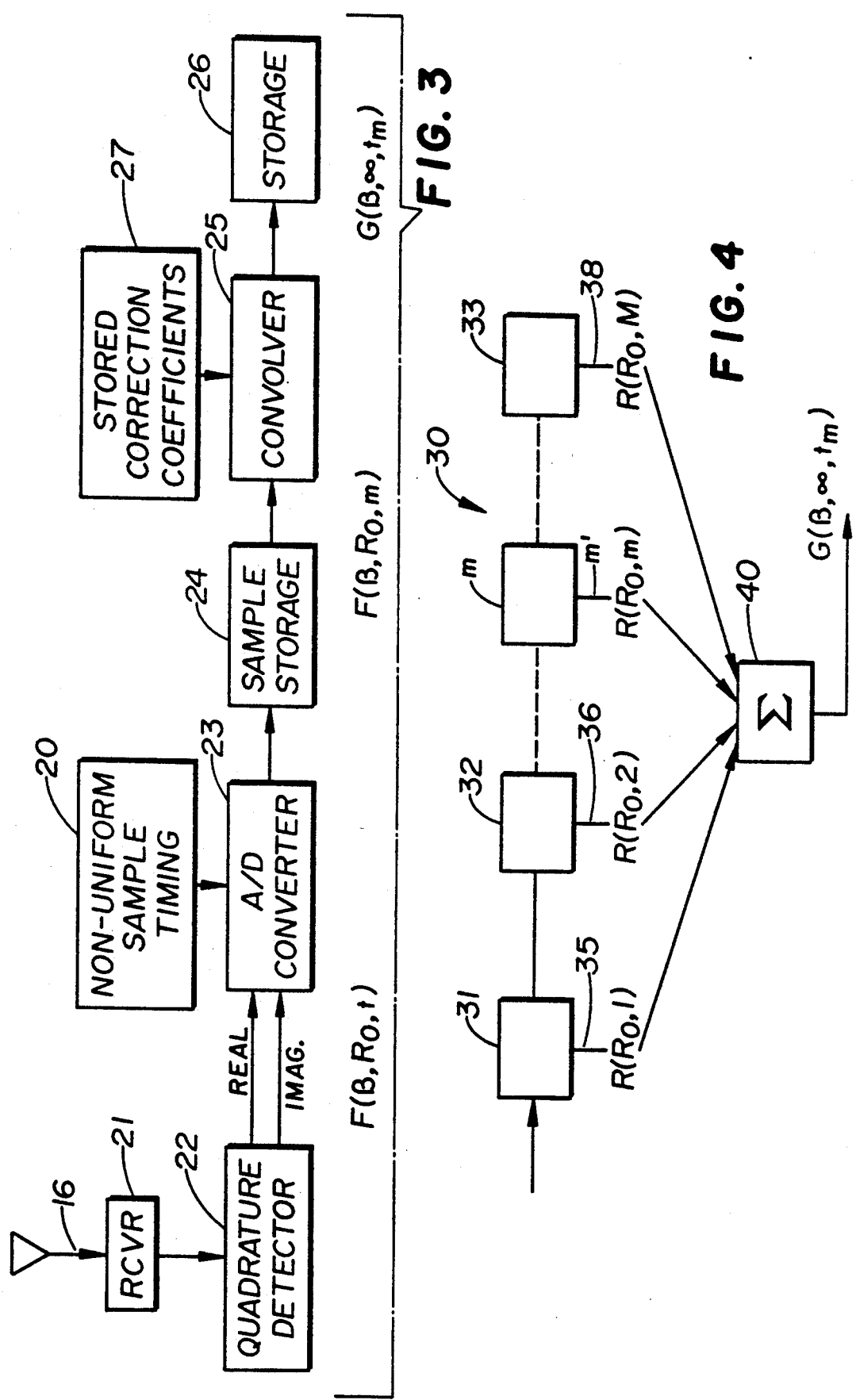

METHOD FOR FIELD MONITORING OF A PHASED ARRAY MICROWAVE LANDING SYSTEM FAR FIELD ANTENNA PATTERN EMPLOYING A NEAR FIELD CORRECTION TECHNIQUE

This application is a continuation-in-part of application Ser. No. 803,233, filed Dec. 5, 1991, now abandoned.

FIELD OF THE INVENTION

The present invention provides an improved method for error-corrected near field monitoring of the far field pattern generated by a Microwave Landing System (MLS) transmitting antenna. More particularly, the invention relates to a method of MLS near field signal monitoring which reconstructs the entire main beam portion of the far field pattern generated by a scanning phased array antenna, and does so in a fashion which compensates for near field effects.

BACKGROUND OF THE INVENTION

Field monitors are employed in airport Microwave Landing Systems to check the accuracy and quality of the signal radiated by the MLS antenna. For realism, the field monitor should measure the same guidance beam as would be measured by an airborne MLS receiver. However, such realism requires that the monitor antenna be located in the far field of the MLS antenna, far removed from the distortions encountered in the near field of the MLS antenna. It is generally recognized that far field antenna pattern measurements should be conducted at a minimum distance of $2 D^2/\lambda$, where D is the aperture of the antenna and $\lambda$ is the wavelength of the radiated signal, if near field distortions are to be avoided. If this criterion is followed for a typical MLS antenna (D=12 feet, $\lambda$=0.2 feet), the monitor antenna must be located at a minimum distance of 1440 feet from the MLS antenna.

Few airport environments provide an obstacle-free path of adequate length to permit antenna pattern measurements to be conducted in the far field. Moreover, the signals received by the monitor would likely be corrupted by refractions and reflections from airport installations and from aircraft movements on the runway. The preferred distance for location of the monitor antenna is therefore about 150 feet from the MLS antenna, ahead of such obstructions as runway approach lights. Clearly, the monitor antenna is then well into the near field of the MLS antenna and cannot measure the guidance beam as would a distant airborne receiver.

Near field distortion effects occur because the r.f. path delays between the monitor antenna and radiating elements of the array at the outer edges of the transmitting antenna aperture are significantly different from the path delays between the monitor antenna and radiating elements near the center of the transmitting antenna aperture. Near field effects may be overcome by applying certain compensating factors to the transmitting antenna to cause the guidance beam to be refocused at the monitor antenna. Such a procedure is obviously unacceptable as it results in distortion of the far field guidance beam.

An integral monitor antenna is known and has been used to monitor performance of the MLS transmitting antenna. The integral monitor antenna comprises a slotted waveguide or a similar array of antenna elements that extends completely across the transmitting antenna aperture in very close proximity thereto. Compensation for near field effects is built into the integral monitor antenna so that the signal output of the integral monitor antenna simulates the signal output of a monitor antenna located in the far field of the transmitting antenna. However, it is impractical to duplicate the structure of the integral monitor antenna, considering the necessary changes in scale, when the monitor antenna is to be located at a distance of about 150 feet from the transmitting antenna.

The present invention utilizes the Fourier relationship between the near field pattern and the aperture function to reconstruct the far field pattern of the MLS antenna from sample measurements taken by a monitor antenna located in the near field of the MLS antenna.

U.S. Pat. No. 4,926,186, issued May 15, 1990, to R. J. Kelly and E.F.C. LaBerge, the present inventors, for "FFT-Based Aperture Monitor for Scanning Phased Arrays", owned by the assignee of the present invention, discloses a method in which signal samples, take by an integral monitor antenna or a monitor antenna located in the far field, are processed by Fourier transforms to provide the aperture function of the MLS antenna. Obtaining the aperture function in such manner permits the identification of individual phase shifters or other components of the MLS antenna that may be faulty.

U.S. Pat. No. 4,553,145, issued Nov. 12, 1985, to G. E. Evans for "Method of Forming the Far-Field Beam Pattern of an Antenna", discloses a method based on Fourier transforms for obtaining the far field pattern of a rotating antenna from measurements taken in the near field. The method collects near field signal samples at critical points of the antenna pattern for a partial reconstruction of the far field pattern. Close synchronization of angle transducers at the transmitting antenna pedestal and at the monitor receiver is required.

Accordingly, it is an object of the present invention to provide a method for near field beam monitoring of a scanning phased array MLS antenna which provides a complete reconstruction of the far field beam pattern, and which can be accomplished during normal operation of the array.

SUMMARY OF THE INVENTION

The near field antenna pattern can be represented as the product of the aperture function f(x) and a quadratic phase error term q(x). Using the Fourier convolution theorem in the spatial frequency domain, the near field pattern $F[p,R_0]$ is:

$$F[p,R_0] = F(p) \otimes Q(p)$$

where F(p) is the far field pattern and also the transform of f(x) and Q(p) is the transform of q(x). A correction term Q'(p), which is the complex conjugate of Q(p), is convolved with $F[p,R_0]$ such that:

$$F[p,R_0] \otimes Q'(p) = F(p) \otimes Q(p) \otimes Q'(p) = F(p),$$

since $Q(p) \otimes Q'(p) = \delta(p)$, the delta function.

Briefly, method involves the steps of:

1. Computing the Fourier transform of the complex conjugate of the quadratic phase error term of the near field pattern.

2. Sampling the near field complex antenna pattern of the scanning beam at times corresponding to equal increments of $\sin \beta_s(t)$, where $\beta_s(t)$ is the beam scan angle.

3. Convolving the transform obtained in step (1) with the samples obtained in step (2) to generate the reconstructed far field antenna pattern.

BRIEF DESCRIPTION OF THE DRAWINGS

FIG. 3 is a block diagram of a near field monitor receiver according to the invention.

FIG. 4 is a block diagram of shift register means for convolving complex correction coefficients with the near field antenna pattern measurements.

DETAILED DESCRIPTION OF THE INVENTION

Figure 1:
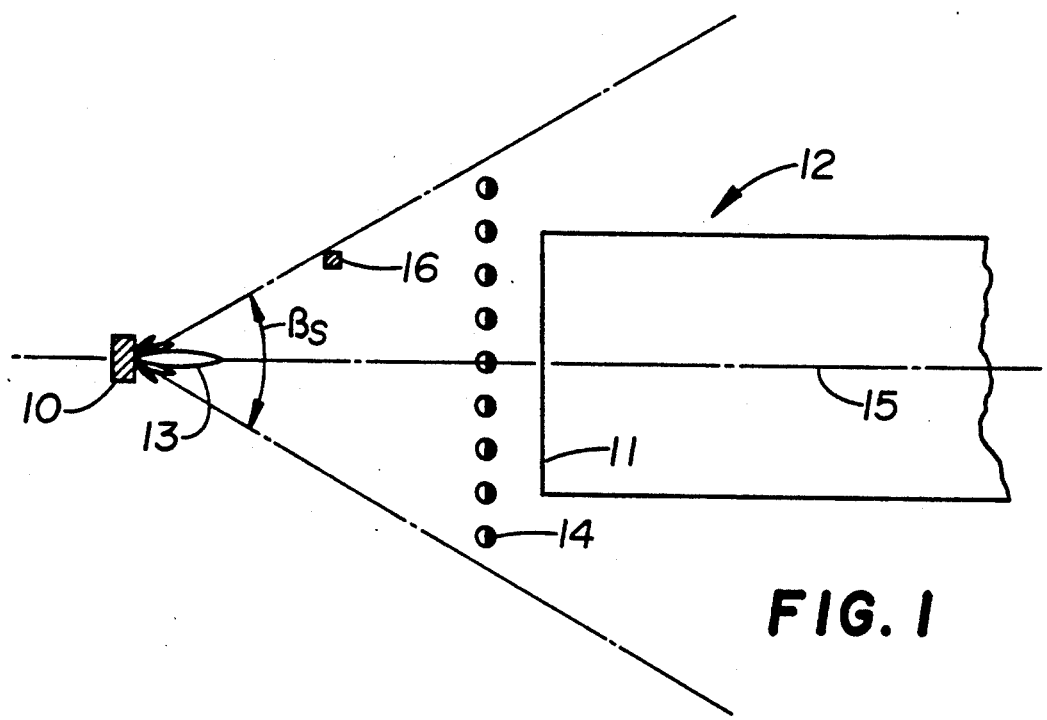
FIG. 1 is an illustration of a typical MLS field monitor arrangement.

FIG. 1 illustrates a typical MLS and near field monitor installation at an airport. A phased array MLS antenna 10 is located beyond the stop end 11 of a runway 12 and obstructions thereabout, such as runway lights 14. Antenna 10 transmits an azimuth guidance beam 13 toward the approach end of runway 12. Beam 13 is scanned through an angle $\beta_s$ about the runway center line 15. Antenna 10 is typically located so that the boresight of the antenna coincides with the runway center line, as shown, but locations offset from the runway center line are allowed. Antenna 10 is typically located about 200 feet from the nearest obstruction, such as lights 14. A field monitor antenna 16 is located in the near field of antenna 10 within the scan coverage area of beam 13, suitably at a distance of about 150 feet.

FIG. 1 shows a typical MLS installation for azimuth guidance. It will be understood that a complete MLS further includes a separate phased array antenna for generating a guidance beam that is scanned in elevation, and that the invention is equally applicable to the near field monitoring of the antenna pattern of the elevation antenna.

Figure 2:
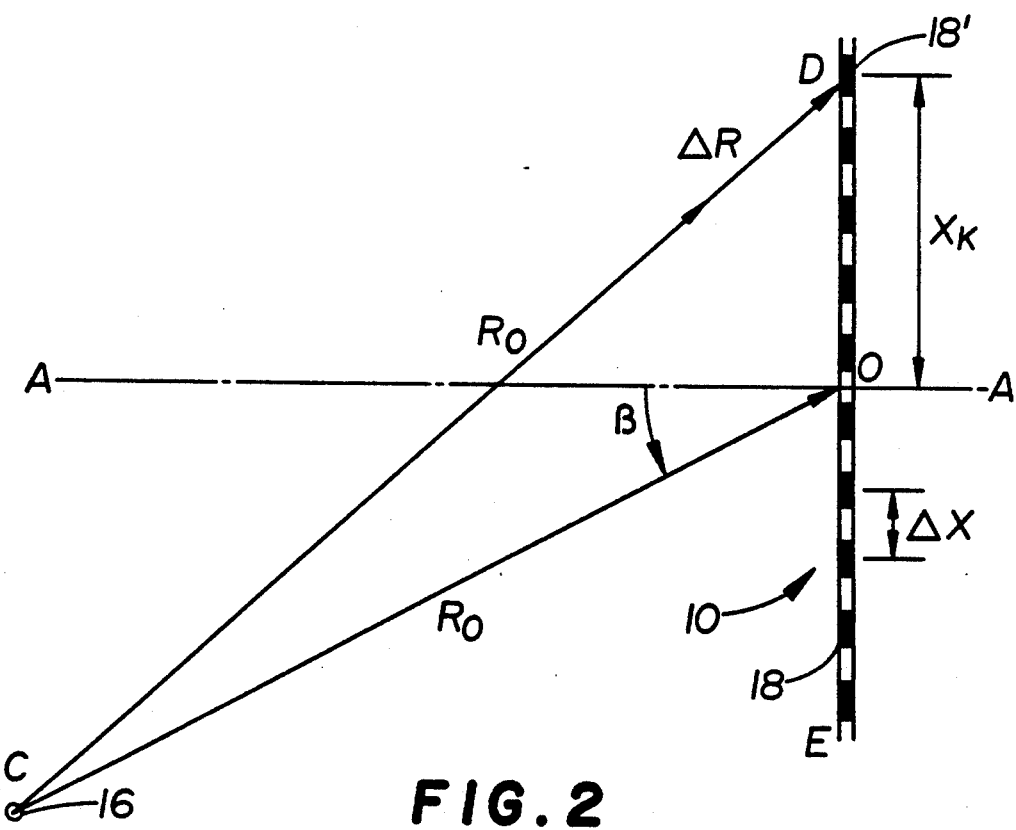
FIG. 2 is a diagram from which the phase error term of the near field antenna pattern can be calculated.

Referring to FIG. 2, phased array antenna 10 comprises a plurality N of radiating elements 18 spaced equally at distances $\Delta x$ across the aperture of the antenna. The normal to the linear array of elements 18, line A—A, is the boresight of the antenna. Monitor antenna 16 is positioned at a distance $R_0$ from the center 0 of the array at a bearing angle $\beta$ to the boresight A—A. The distance from monitor antenna 16 to any element of the array is $R_0 \pm \Delta R$. Selecting element 18' as an example, the solution of triangle OCD is:

$$(R_0 + \Delta R)^2 = R_0^2 + x_k^2 + 2R_0 x_k^2 \sin\beta \quad (1)$$

For $x_k/R_0 << 1$, $$\Delta R \approx R_0 \left[ \frac{x_k}{R_0} \sin\beta + \frac{1}{2}\left(\frac{x_k}{R_0}\right)^2 \right] \quad (2)$$

The quadratic term of equation (2) appears as the phase error term in the near field antenna pattern $F(\beta, R_0, t)$, equation (3), for a phased array antenna 10 having N elements 18, measured by a monitor antenna 16 located at a distance $R_0$ from the center of the array.

$$F(\beta, R_0, t) = \sum_{k=0}^{N-1} a_k e^{j\frac{2\pi}{\lambda} x_k \sin\beta} e^{-j\frac{2\pi}{\lambda} x_k \sin\beta_s(t)} e^{-j\frac{\pi}{\lambda R_0} x_k^2} \quad (3)$$

where:

$a_k$ is the voltage excitation of element (k), $k = 0, 1 \ldots N-1$;

$\beta$ is the bearing angle of monitor antenna 16 from A—A; and $$x_k = \Delta x \left( k - \frac{N+1}{2} \right)$$

Equation (3) contains three exponential terms. The first (which is a function of $\beta$) being the spatial term, the second (a function of $\beta_s(t)$) the temporal term, and the third (a function of $R_0$) the quadratic defocusing term. The far field pattern of antenna 10 can be obtained from equation (3) by allowing $R_0$ to approach infinity, thus:

$$F(\beta, \infty, t) = \sum_{k=0}^{n-1} a_k e^{j\frac{2\pi}{\lambda} x_k \sin\beta} e^{-j\frac{2\pi}{\lambda} x_k \sin\beta_s(t)} \quad (4)$$

Equation (4) is a Fourier transform of the aperture function with the temporal exponential term forming the Fourier Kernel. When a phase correction term, $$e^{j\frac{\pi}{\lambda R_0} x_k^2} \quad (4a)$$

corresponding to the conjugate of the quadratic phase error term, is imposed on the aperture function, the following characterization of the far field pattern, $G(\beta, \infty, t)$, results:

$$G(\beta, \infty, t) = \quad (5)$$

$$\sum_{k=0}^{N-1} [a_k e^{j\frac{2\pi}{\lambda} x_k \sin\beta} e^{-j\frac{\pi}{\lambda R_0} x_k^2}][e^{j\frac{\pi}{\lambda R_0} x_k^2}] e^{-j\frac{2\pi}{\lambda} x_k \sin\beta_s(t)}$$

which is:

$$G(\beta, \infty, t) = \sum_{k=0}^{n-1} f(\beta, R_0, x_k) r(R_0, x_k) e^{-j\frac{2\pi}{\lambda} x_k \sin\beta_s(t)} \quad (6)$$

where $f(\beta, R_0, X_k)$ is the effective aperture function of the transmitting array measured at the field monitor location (including both the spatial and the defocusing terms) and $r(R_0, X_k)$ is the desired refocusing term. Although $r(R_0,x_k)$ can be computed from equation (4a), $f(\beta,R_0,x_k)$ is not directly measurable in this instance.

In applying the method while the MLS antenna is operating with a normal scan, the near field antenna pattern is sampled at non-uniform intervals of time, $t_i$, corresponding to equal increments of $\sin \beta_s(t)$. More particularly, the samples are taken at times $t_i$ such that:

$$t_i = \frac{\sin^{-1}\left[\frac{\lambda}{2\Delta x}\left(1 - \frac{2i}{M}\right)\right]}{\Theta_s} - t_0 \quad (7)$$

where:
$\Theta_s$ is the scan rate of the MLS antenna beam;
$t_0$ is the time at which the beam scans through 0 degrees; and $$\sin\beta_s(t_i) = \frac{\lambda i}{\Delta x M} \quad (8)$$

By substituting equation (8) into equation (6), the following Discrete Fourier Transform is obtained:

$$G(\beta,\infty,i) = \sum_{k=0}^{N-1} f(\beta,R_0,k)r(R_0,k)e^{-j\frac{2\pi}{M}(k-\frac{N+1}{2})} \quad (9)$$

Rearranging equation (9), $$G(\beta,\infty,i) = e^{j\frac{2\pi(N+1)i}{2M}} \sum_{k=0}^{N-1} f(\beta,R_0,k)r(R_0,k)e^{-j\frac{2\pi ki}{M}} \quad (10)$$

Finally, $$G(\beta,\infty,i) = e^{j\frac{2\pi(N+1)i}{2M}} F(\beta,R_0,i) \; R(R_0,i) \quad (11)$$

The final step illustrated above relies upon the Fourier property that the transform of the product $f(\beta,R_0,k) r(R_0,k)$ is the convolution of the individual transforms $F(\beta,R_0,i)$ $R(R_0,i)$. The transform $F(\beta,R_0,i)$ is obtained by sampling the near field antenna pattern at intervals $t_i$. The coefficients $R(R_0,i)$ are precomputed from equation (12) below using the specific values of $R_0$, $X_k$, and $N$ that are dependent on a particular monitor installation site and MLS antenna. The value of M is selected to provide a sufficient number of samples to obtain the accuracy desired. Suitably, M=256 and typically N=48.

$$R(R_0,m) = e^{j\frac{2\pi(N+1)m}{2M}} \sum_{k=0}^{N-1} r(R_0,k)e^{-j\frac{2\pi mk}{M}} \quad (12)$$

$$R(R_0,m) = e^{j\frac{2\pi(N+1)m}{2M}} \sum_{k=0}^{N-1} e^{j\frac{\pi}{\lambda R_0} xk^2} e^{-j\frac{2\pi mk}{M}}$$

Referring to FIG. 3, the MLS beam signals $F(\beta,R_0,t)$ induced in monitor antenna 16 are amplified and converted to i.f. frequency by a receiver 21. A quadrature detector 22 converts the i.f. output of receiver 21 into complex real and imaginary components of $F(\beta,R_0,t)$. The analog outputs of detector 22 are applied to an A/D converter 23 that is controlled by a timer 20 so as to produce digitized real and imaginary samples of $F(\beta,R_0,t)$ at intervals $t_i$, where $t_i$ is defined in equation (7). The real and imaginary samples $F(\beta,R_0,m)$ from converter 23 are stored in sample storage 24 for use in a complex convolution routine or for application to a complex convolver 25 that convolves the samples with the precomputed coefficients $R(R_0,i)$ stored at 27. The complex outputs of convolver 25, comprising the real and imaginary components of $G(\beta,\infty,t_m)$, are stored in memory 26 whence they may be retrieved for conversion into points of signal amplitude, A, at times, t, for display, plotting, or other processing of the far field antenna pattern of the MLS antenna. Conversion of the components stored in memory 26 into amplitudes merely involves the simple calculation $A=[(\text{real})^2+(\text{imag.})^2]^{\frac{1}{2}}$.

FIG. 4 is a simplified block diagram of a shift register means for performing the operations of convolver 25. It will be understood that such shift register means are provided for processing the complex sample outputs of A/D converter 23 via complex multiplication and summation operations. Samples from storage 24 are successively applied to an M stage shift register 30 comprising stages 31-m-33 spaced at intervals corresponding to equal increments of $\sin \beta_s(t)$. The output 35-m'-38 of each stage 31-m-33 is weighted with the appropriate one of the precomputed coefficients $R(R_0,m)$, i.e., the mth stage output is weighted with the mth coefficient, so that as each of the i samples is clocked through a register stage m, the product of that sample and the mth coefficient is output to an accumulator 40. When the first (i=1) sample is clocked out of the final register stage 33, the Mth stage, the contents of accumulator 40 are shifted into memory 26. The new contents of accumulator 40 are shifted into storage 26 as the second, and each succeeding sample, is clocked out of register stage 33. Processing of the near field samples for conversion into the far field pattern is completed when all M samples of the measured waveform $f(\beta,R_0,t)$ have been passed through convolver 25.

Figure 5:
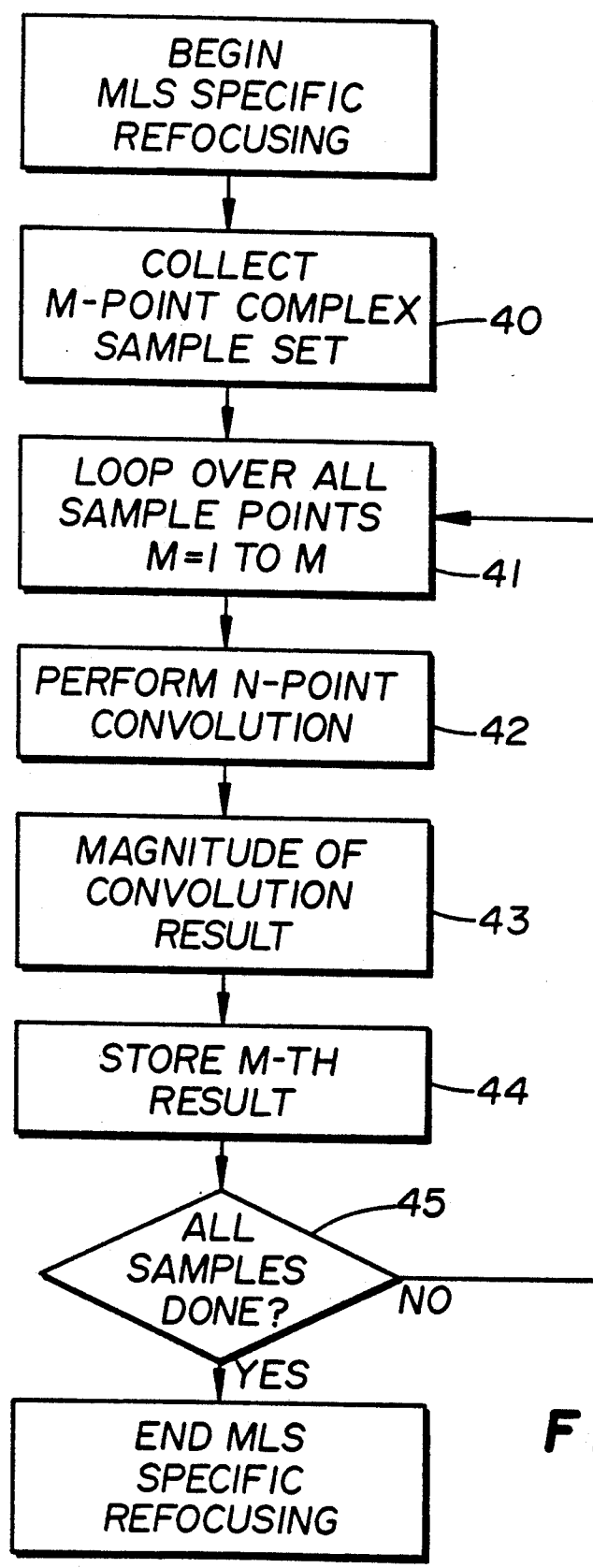
FIG. 5 is a flow chart showing the processing of near field antenna pattern measurements to produce a far field antenna pattern.

FIG. 5 is a flow chart describing the processing of samples of the near field antenna pattern to obtain the far field pattern. Processing begins (box 40) with the collection of M real and imaginary samples of the near field pattern at times $t_i$. These samples are placed in storage 24 (FIG. 3). The real and imaginary samples are processed separately in a routine, or in a convolver as shown in FIG. 4, the operation of which is shown by boxes 41–44. A sample is called from storage (41) and an N-point convolution (42) is performed thereon in which each set of N consecutive samples is multiplied in turn by the corresponding correction coefficients $R(R_0,1) \ldots R(R_0,M)$, with the result of each multiplication being accumulated (43), and the accumulated sum is placed in storage (44) as the multiplication of each sample m by the coefficient $R(R_0,M)$ is completed. Decision block 45 iterates the steps of sample fetching, convolving, sum accumulation, and storage until all M samples have been processed.

Figure 6:
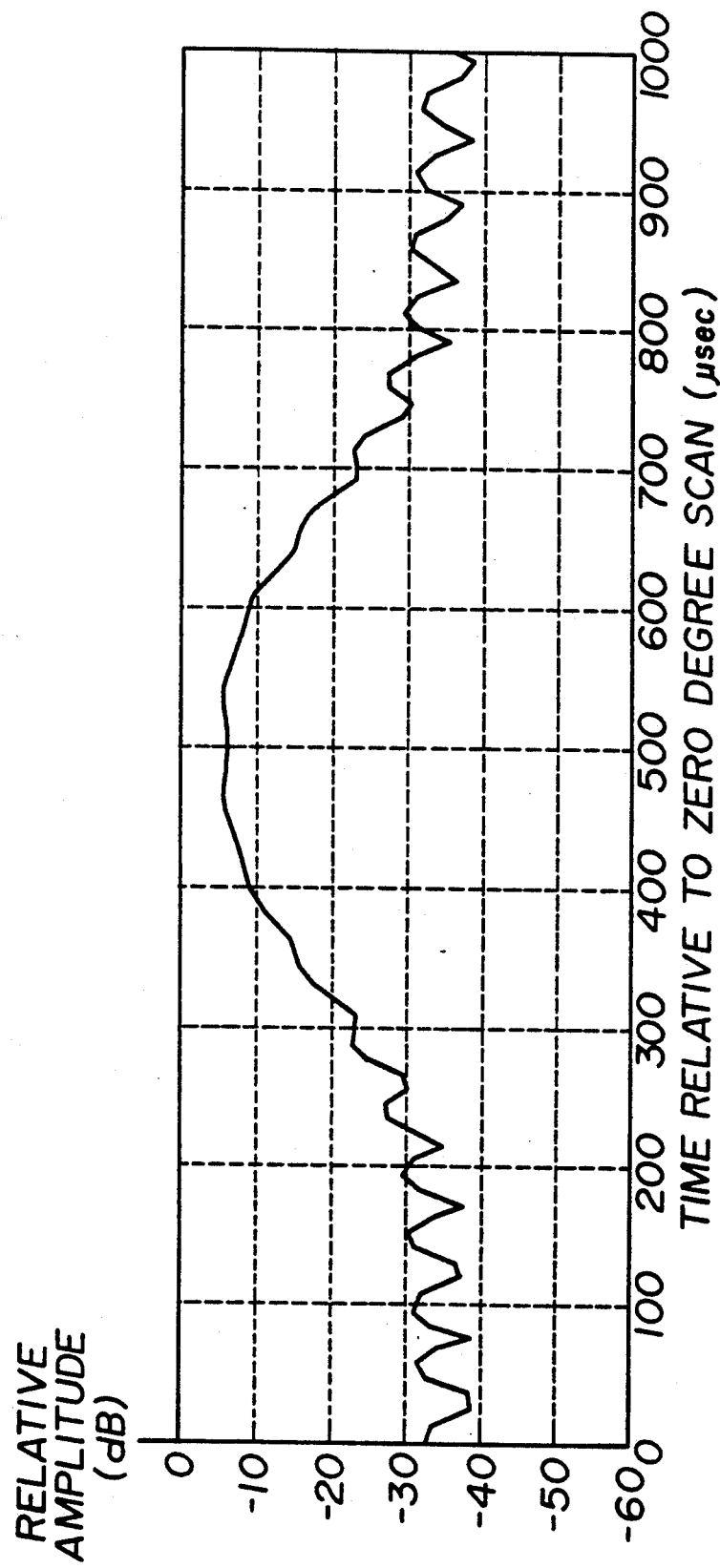
FIG. 6 shows a near field pattern of a typical MLS antenna as measured by a monitor located 100 feet from the MLS antenna.

FIG. 6 shows the near field pattern of an MLS phased array antenna as measured by a monitor located 100 feet from the MLS antenna but without refocusing according to the invention. The MLS operated at 5060.7 Mhz.

Figure 7:
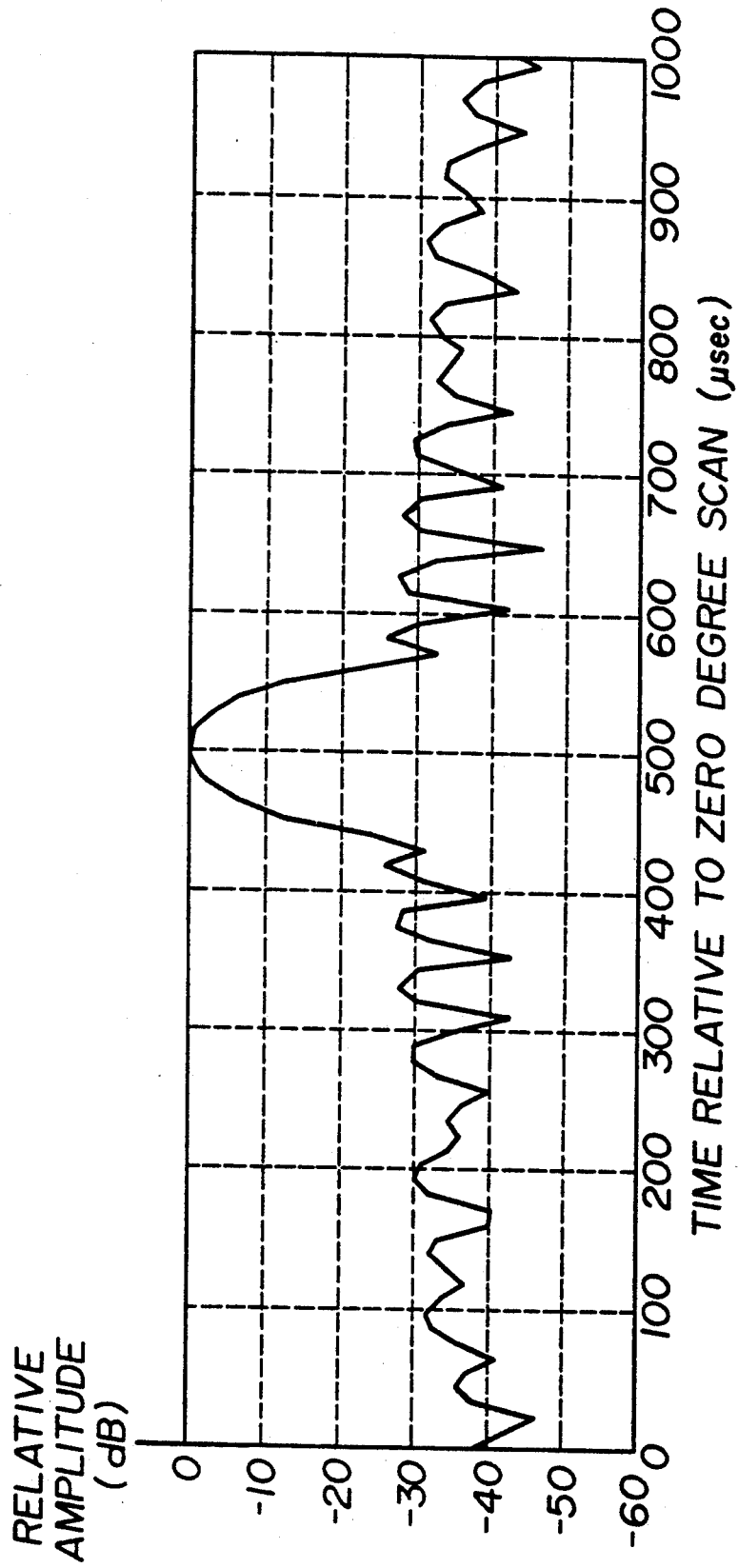
FIG. 7 shows the pattern of FIG. 6 after refocusing according to the invention.
Figure 8:
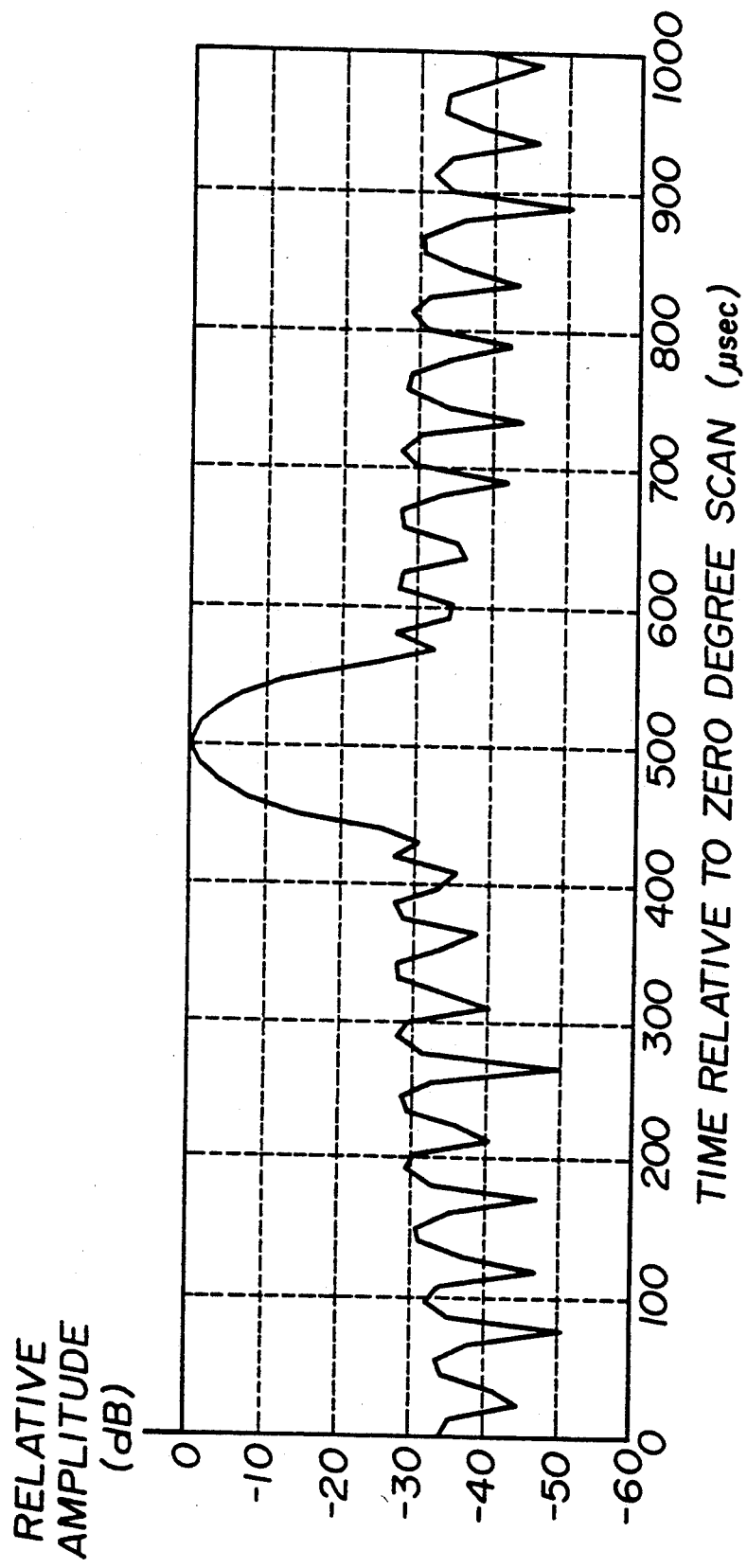
FIG. 8 shows the far field pattern of the MLS antenna used in preparation of FIG. 6, as measured by a monitor located in the far field; and, FIG. 9 is a graph showing the error between the corrected near field pattern of FIG. 7 and the far field pattern of FIG. 8.
Figure 9:
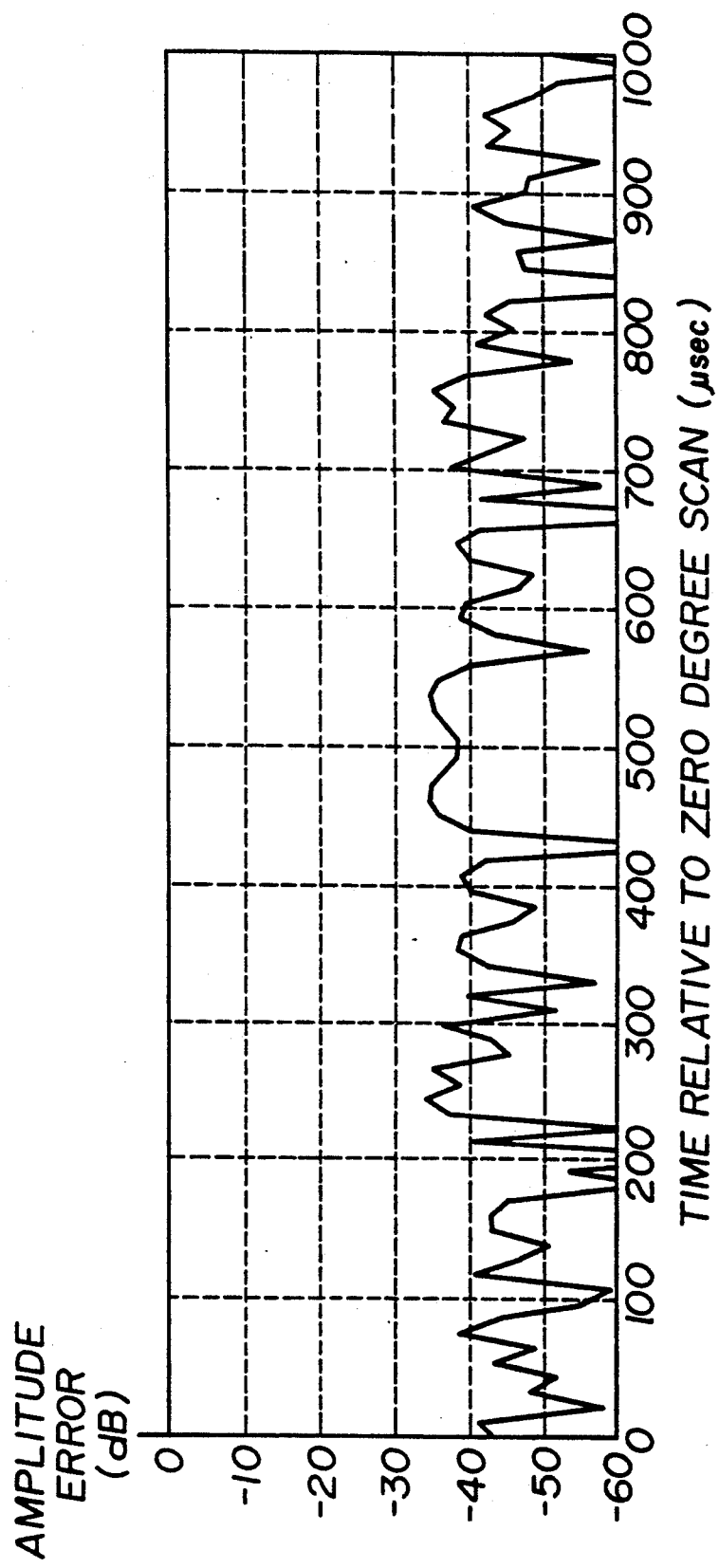

FIG. 7 shows the pattern of the MLS antenna measured from the near field as in FIG. 6 with refocusing according to the invention. FIG. 8 shows the pattern of the MLS antenna used in preparation of FIG. 6 as measured by a monitor located in the far field; and FIG. 9 shows the difference between the patterns of FIG. 7 and FIG. 8.

A development of the mathematical basis of the invention that is more complete than that given above follows.

The discrete convolution of equation (11) is:

$$U(m) = \frac{1}{M} \sum_{l=-\frac{M}{2}}^{\frac{M}{2}-1} F(l)R(m-l) \quad (13)$$

Using the Fourier Kernel defined in equation (10), the individual transform terms are as follows:

$$F(\beta,R_0,m) = e^{j\frac{2\pi(N+1)m}{2M}} \sum_{k=0}^{N-1} f(\beta,R_0,k) e^{-j\frac{2\pi mk}{M}} \quad (14)$$

$$R(R_0,m) = e^{j\frac{2\pi(N+1)m}{2M}} \sum_{k=0}^{N-1} r(R_0,k) e^{-j\frac{2\pi mk}{M}}$$

$$U(m) = \frac{1}{M} \sum_{l=-\frac{M}{2}}^{\frac{M}{2}-1} F(\beta,R_0,l) R(R_0,m-l)$$

$$U(m) =$$

$$\frac{1}{M} \sum_{l=-\frac{M}{2}}^{\frac{m}{2}-1} \left[ e^{j\frac{2\pi(N+1)l}{2M}} \sum_{k=0}^{N-1} f(\beta,R_0,k) e^{-j\frac{2\pi lk}{M}} \right] \times$$

$$\left[ e^{j\frac{2\pi(N-1)(m-l)}{2M}} \sum_{n=0}^{N-1} r(R_0,n) e^{-j\frac{2\pi(m-l)k}{M}} \right]$$

$$U(m) = \frac{1}{M} \sum_{l=-\frac{M}{2}}^{\frac{M}{2}-1} e^{j\frac{2\pi(N+1)m}{2M}} \sum_{k=0}^{N-1} \sum_{n=0}^{N-1} f(\beta,R_0,k) \times$$

$$[e^{-j\frac{2\pi(k-n)l}{M}} e^{-j\frac{2\pi mn}{M}}]$$

It is well known that for Discrete Fourier Transforms:

$$\delta(k-n) = \frac{1}{M} \sum_{l=-\frac{M}{2}}^{\frac{M}{2}-1} e^{-\frac{2\pi l(k-n)}{M}} \quad (15)$$

$$= \begin{vmatrix} 1 \text{ if } k = n \\ 0 \text{ otherwise} \end{vmatrix}$$

Applying equation (15) to equation (14) eliminates all terms where k is not equal to n, and yields:

$$U(m) = e^{j\frac{2\pi(N+1)m}{2M}} \sum_{n=0}^{N-1} f(\beta,R_0,n) r(R_0,n) e^{-j\frac{2\pi nm}{M}} \quad (16)$$

$$U(m) = \sum_{n=0}^{N-1} f(\beta,R_0,n) r(R_0,n) e^{-j\frac{2\pi m(n-\frac{M-1}{2})}{M}}$$

Finally, substituting the fully expanded forms of f(*) and r(*) into equation (16):

$$U(m) =$$

-continued $$\sum_{n=0}^{N-1} [a_n e^{j\frac{2\pi}{\lambda} x \sin\beta} e^{-j\frac{\pi}{\lambda R_0} xn^2}][e^{j\frac{\pi}{\lambda R_0} xn^2}] e^{-j\frac{2\pi}{\lambda} x \sin\beta_s(t_m)}$$

$$U(m) = \sum_{n=0}^{N-1} a_n e^{j\frac{2\pi}{\lambda} xk \sin\beta} e^{-j\frac{2\pi}{\lambda} xk \sin\beta_s(t_m)}$$

$$= F(\beta, \infty, t_m)$$

which is the far field pattern given by equation (4).

It will be understood that the particular embodiments described above are only illustrative of the principles of the present invention, and that various modifications could be made by those skilled in the art without departing from the spirit and scope of the present invention, which is limited only by the claims that follow.

We claim:

1. A method of monitoring the far field antenna pattern of a phased array Antenna using a monitor antenna located in the near field of said phased array antenna, said phased array antenna transmitting a beam that is scanned at a constant rate, the scan angle of said beam relative to the boresight of said phased array antenna, at any time (t), being $\beta_s(t)$; said method comprising:

computing the Fourier transform of complex conjugates of the phase error term contained in the near field pattern of said phased array antenna, said phase error term being due to said location of said monitor antenna in the near field;

measuring the antenna pattern of said phased array antenna received by said monitor antenna to provide the measured near field pattern of said phased array antenna, said measuring step including the steps of:

applying the signals induced in said monitor antenna by said beam of said phased array antenna to a receiver to provide a signal output corresponding to the near field pattern of said phased array antenna;

detecting in a quadrature detector said output of said receiver to provide complex real and imaginary components of said output;

collecting samples from both said real and imaginary components of said receiver output at times $t_i$ such that said times $t_i$ correspond to equal increments of sin $\beta_s(t)$, said collected samples constituting said measured near field pattern of said phased array antenna; and convolving said measured near field pattern with said computed Fourier transform to obtain the complex real and imaginary components of the far field pattern of said phased array antenna.

2. A method as claimed in claim 1, wherein said computed Fourier transform comprises a sequence of correction coefficients $R(R_0,m)$, where m=1, 2, ... M, and wherein said step of convolving said measured near field pattern with said computed Fourier transform includes:

providing a shift register having a total of M successive stages m, where m=1, 2, ... M;

weighting the output at each stage m of said shift register with the corresponding one of said correction coefficients $R(R_0,m)$;

applying said collected samples of said real and imaginary components sequentially to said shift register;

shifting said applied samples serially through said shift register;

accumulating the sum of the weighted outputs of said shift register as said samples are shifted through said shift register; and storing said accumulated sum at the time the first of said applied samples is shifted out of the Mth stage of said shift register, and at the time each succeeding one of said applied samples is shifted out of the Mth stage of said shift register, said stored accumulated sums constituting the complex components of the far field pattern of said phased array antenna.

* * * * *